United States Patent
LiCausi et al.

(10) Patent No.: US 10,707,119 B1
(45) Date of Patent: Jul. 7, 2020

(54) INTERCONNECT STRUCTURES WITH AIRGAPS AND DIELECTRIC-CAPPED INTERCONNECTS

(71) Applicant: GLOBALFOUNDRIES Inc., Grand Cayman (KY)

(72) Inventors: Nicholas V. LiCausi, Watervliet, NY (US); Jeremy A. Wahl, Portland, OR (US); Vimal K. Kamineni, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/246,847

(22) Filed: Jan. 14, 2019

(51) Int. Cl.
*H01L 21/768* (2006.01)
*H01L 23/528* (2006.01)
*H01L 23/532* (2006.01)

(52) U.S. Cl.
CPC .... *H01L 21/7682* (2013.01); *H01L 21/76828* (2013.01); *H01L 21/76837* (2013.01); *H01L 23/528* (2013.01); *H01L 23/5329* (2013.01); *H01L 23/53295* (2013.01); *H01L 2221/1042* (2013.01)

(58) Field of Classification Search
CPC ......... H01L 21/7682; H01L 2221/1042; H01L 23/5329; H01L 23/528; H01L 21/76837
See application file for complete search history.

(56) References Cited

U.S. PATENT DOCUMENTS

| 6,492,256 | B2 | 12/2002 | Lee et al. |
| 9,496,224 | B2 | 11/2016 | Ting et al. |
| 9,553,019 | B1 | 1/2017 | Briggs et al. |
| 9,653,348 | B1* | 5/2017 | Wu .................. H01L 21/76816 |
| 2013/0323930 | A1* | 12/2013 | Chattopadhyay .......................... H01L 21/02107 438/703 |
| 2017/0194243 | A1* | 7/2017 | Wu ...................... H01L 23/5226 |
| 2018/0164698 | A1* | 6/2018 | Yang .................... G03F 7/70633 |

* cited by examiner

*Primary Examiner* — Selim U Ahmed
*Assistant Examiner* — Evan G Clinton
(74) *Attorney, Agent, or Firm* — Thompson Hine LLP; Anthony Canale

(57) ABSTRACT

Structures that include interconnects and methods for forming a structure that includes interconnects. A metallization level includes a metallization level having a first interconnect with a first top surface, a second interconnect with a second top surface, and a cavity with an entrance between the first interconnect and the second interconnect. A first dielectric layer includes a first section arranged on the first top surface of the first interconnect and a second section arranged on the second top surface of the second interconnect. The first section of the first dielectric layer is separated from the second section of the first dielectric layer by the entrance of the cavity. A second dielectric layer is arranged to surround the cavity and to close the entrance to the cavity in order to encapsulate an airgap inside the cavity.

14 Claims, 4 Drawing Sheets

INTERCONNECT STRUCTURES WITH AIRGAPS AND DIELECTRIC-CAPPED INTERCONNECTS

BACKGROUND

The present invention relates to semiconductor device fabrication and integrated circuits and, more specifically, to structures that include interconnects and methods for forming a structure that includes interconnects.

An interconnect structure may be used to provide connections with device structures fabricated by front-end-of-line (FEOL) processing. A back-end-of-line (BEOL) portion of the interconnect structure may include metallization levels formed using a damascene process in which via openings and trenches are etched in a interlayer dielectric layer and filled with metal to create vias and lines of the different metallization levels. The interlayer dielectric layer may be formed from low-k dielectric materials that provide a reduced capacitance.

Further reductions in capacitance may be achieved through the use of airgaps, which have a minimum achievable permittivity. The airgaps are formed after the lines of the metallization level are formed in the interlayer dielectric layer. An etching process is used to remove the interlayer dielectric layer between the lines and define cavities in regions where airgaps are desired. A conformal dielectric layer is deposited that coats the surfaces surrounding the cavities and pinches off at the cavity entrances to surround and encapsulate the airgaps. The etching process may damage the metal forming the lines, especially if an over-etch is required to remove the interlayer dielectric layer. For example, the etching process may erode and bevel or round the corners of the lines. The loss of the metal at the corners of the lines results in an increased resistance, which degrades performance and at least in part defeats the purpose underlying the introduction of airgaps to reduce the capacitance.

Improved structures that include interconnects and methods for forming a structure that includes interconnects are needed.

SUMMARY

In an embodiment of the invention, a structure includes a metallization level having a first interconnect with a first top surface, a second interconnect with a second top surface, and a cavity with an entrance between the first interconnect and the second interconnect. A first dielectric layer includes a first section arranged on the first top surface of the first interconnect and a second section arranged on the second top surface of the second interconnect. The first section of the first dielectric layer is separated from the second section of the first dielectric layer by the entrance of the cavity. A second dielectric layer is arranged to surround the cavity and to close the entrance to the cavity in order to encapsulate an airgap inside the cavity.

In an embodiment of the invention, a method includes forming a metallization level including a first interconnect and a second interconnect in an interlayer dielectric layer, and selectively depositing a first section of a first dielectric layer on a first top surface of the first interconnect and a second section of the first dielectric layer on a second top surface of the second interconnect. After forming the first dielectric layer, a portion of the interlayer dielectric layer is removed to form a cavity with an entrance between the first interconnect and the second interconnect. The method further includes depositing a second dielectric layer on surfaces surrounding the cavity that pinches off to encapsulate an airgap inside the cavity.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
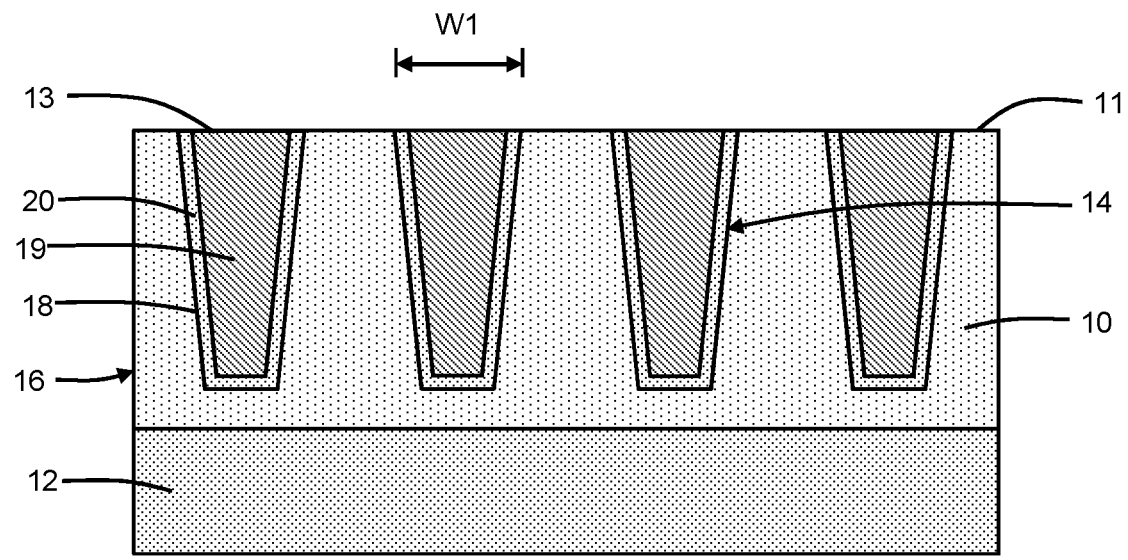
FIGS. 1-6 are cross-sectional views of a structure at successive fabrication stages of a processing method in accordance with embodiments of the invention.

With reference to FIG. 1 and in accordance with embodiments of the invention, a metallization level 16 includes an interlayer dielectric layer 10 arranged on a substrate 12 and interconnects 14 formed in openings 18 that are defined in the interlayer dielectric layer 10. The interlayer dielectric layer 10 may be composed of an electrical insulator, such as a low-k dielectric material like hydrogen-enriched silicon oxycarbide (SiCOH) produced from an octamethylcyclotetrasiloxane (OMCTS) precursor, or another type of low-k or ultra-low-k dielectric material that contains oxygen. The substrate 12 may include device structures formed by front-end-of-line (FEOL) processes in a semiconductor layer, as well as one or more metallization levels formed by middle-of-line (MOL) processing or by back-end-of-line (BEOL) processing.

The openings 18 in the interlayer dielectric layer 10 may be formed by lithography and etching processes at selected locations distributed across the surface area of interlayer dielectric layer 10. The openings 18 may be contact openings, via openings, or trenches and, in that regard, may have an aspect ratio of height-to-width that is characteristic of a contact opening, a via opening, or a trench. In an embodiment, the openings 18 may be trenches that are formed in the interlayer dielectric layer 10.

The interconnects 14 may include a conductor layer 19 and a barrier/liner layer 20 arranged between the conductor layer 19 and the surfaces of the interlayer dielectric layer 10 bordering each of the openings 18. The barrier/liner layer 20 coats the openings 18 with a given conformal thickness, and is arranged between the conductor layer 19 and the interlayer dielectric layer 10. The barrier/liner layer 20 may be composed of one or more conductive materials (i.e., conductors), such as titanium nitride (TiN), tantalum nitride (TaN), tantalum (Ta), titanium (Ti), tungsten (W), tungsten nitride (WN), cobalt (Co), ruthenium (Ru), rhenium (Re), a layered stack of these conductive materials (e.g., a bilayer of Ti and TiN), or a combination of these conductive materials, deposited by, for example, physical vapor deposition or chemical vapor deposition. The conductor layer 19 of the interconnects 14 is deposited in the openings 18 after the barrier/liner layer 20 is deposited. The conductor layer 19 may be composed of a metal, such as copper (Cu), cobalt (Co), tungsten (W), or ruthenium (Ru) that is deposited by electroless or electrolytic deposition using a seed layer. The respective materials of the barrier/liner layer 20 and the conductor layer 19 also deposit in the field area on the top surface 11 of the interlayer dielectric layer 10, and may be removed from the field area with a chemical mechanical polishing (CMP) process.

Following the CMP process, each of the interconnects 14 has a top surface 13 that is substantially coplanar with the top surface 11 of the interlayer dielectric layer 10. The top surface 13 of each of the interconnects 14 has a surface area with dimensions that may be defined by a width, W1, and a length in a lengthwise direction transverse to the width.

Figure 2:
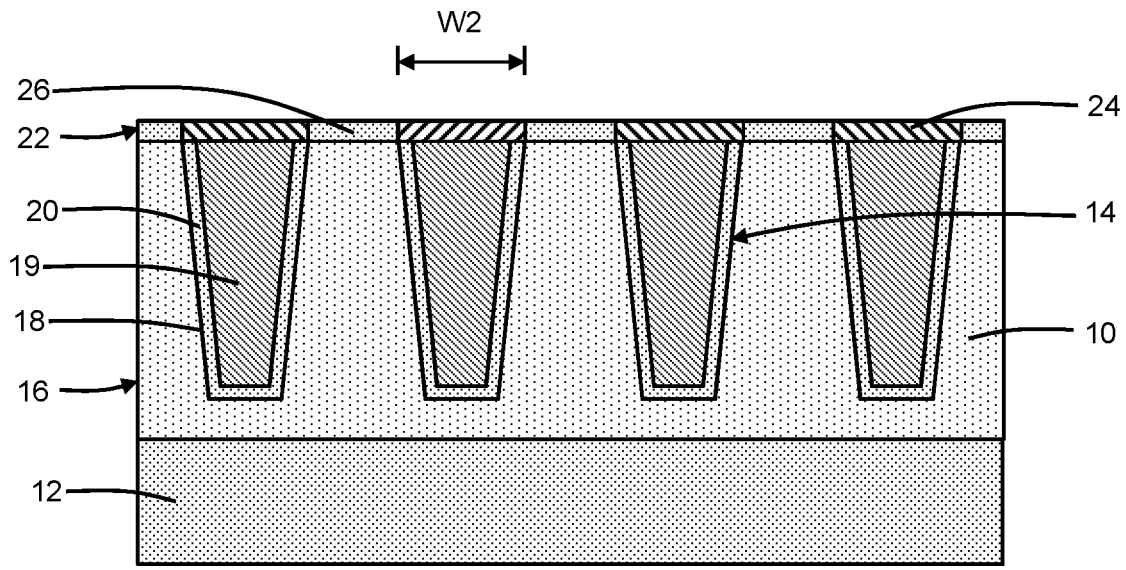

With reference to FIG. 2 in which like reference numerals refer to like features in FIG. 1 and at a subsequent fabrication stage, a dielectric layer 22 is formed by deposition and/or growth on the interlayer dielectric layer 10 and on the interconnects 14. The dielectric layer 22 may be a composite structure with sections 24 that are arranged on the interconnects 14 and sections 26 that are arranged on the interlayer dielectric layer 10. In an embodiment, the sections 24 of the dielectric layer 22 are each in direct contact with the interconnects 14, and the sections 26 of the dielectric layer 22 are each in direct contact with the interlayer dielectric layer 10. In an embodiment, the sections 24 of the dielectric layer 22 are in direct contact with the respective top surfaces 13 of the interconnects 14, and the sections 26 of the dielectric layer 22 are each in direct contact with the top surface 11 of the interlayer dielectric layer 10. The dielectric layer 22 may be formed by an atomic layer deposition process in which the sections 24, 26 are concurrently formed. The sections 24 of the dielectric layer 22 are juxtaposed with the sections 26 of the dielectric layer 22.

One of the sections 24 of the dielectric layer 22 is arranged on the top surface 13 of each interconnect 14. Each section 24 has an area with dimensions that may be defined by a width, W2, and a length in a lengthwise direction transverse to the width. The area of each section 24 may be equal to, or substantially equal to, the surface area of the interconnect 14 on which it is arranged.

The sections 24 of the dielectric layer 22 have a different composition from the sections 26 of the dielectric layer 22. In an embodiment, the sections 26 of the dielectric layer 22 may include a concentration of an element originating from the interlayer dielectric layer 10 and the sections 24 of the dielectric layer 22 may lack the element. The element may be transported from interlayer dielectric layer 10 to the sections 26 of the dielectric layer 22 by solid-phase diffusion. The interconnects 14 lack the element and, therefore, the element is not available for transport from the interconnects 14 to the sections 24 of the dielectric layer 22. In an embodiment, the element that is transported from the interlayer dielectric layer 10 to the overlying sections 26 of the dielectric layer 22 may be oxygen. In an embodiment, the sections 24 of the dielectric layer 22 may be composed of aluminum nitride, the sections 26 of the dielectric layer 22 may be composed of aluminum oxynitride, and the interconnects 14 may be composed of copper.

In an embodiment, the dielectric layer 22 may be thermally annealed following its deposition to increase the thickness of the sections 26 of the dielectric layer 22. For example, the thermal anneal may be performed at a substrate temperature of less than or equal to 400° C. in an atmosphere containing either nitrogen or a reducing gas, such as hydrogen.

In an alternative embodiment, the deposition conditions used to form the dielectric layer 22 may be tuned such that the sections 26 of the dielectric layer 22 are not formed. Instead, under the selected set of tuned deposition conditions, only the sections 24 of the dielectric layer 22 are formed on the interconnects 14.

Figure 3:
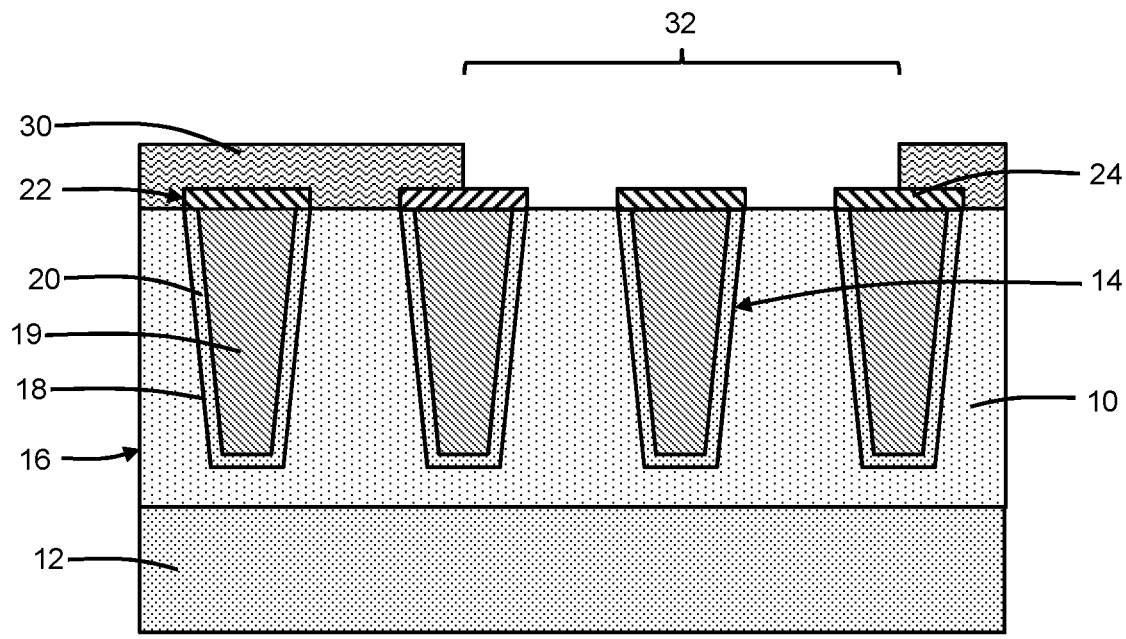

With reference to FIG. 3 in which like reference numerals refer to like features in FIG. 2 and at a subsequent fabrication stage, the sections 26 of the dielectric layer 22 may be removed by an etching process selective to the sections 24 of the dielectric layer 22. As used herein, the term "selective" in reference to a material removal process (e.g., etching) denotes that the material removal rate (i.e., etch rate) for the targeted material is higher than the material removal rate (i.e., etch rate) for at least another material exposed to the material removal process. In an embodiment, the etching process may be a wet chemical etching process. The presence of the element (e.g., oxygen) in the sections 26 of the dielectric layer 22 is leveraged in the selection of the etching process to provide the selectivity. For example, the etching process, which may be a wet chemical etching process that relies on dilute or buffered hydrofluoric acid, may be selected to remove sections 26 composed of aluminum oxynitride selective to sections 24 composed of aluminum nitride. The removal of the sections 26 of the dielectric layer 22 may be effective to eliminate fringing capacitance between the interconnects 14. The top surface 11 of the interlayer dielectric layer 10 is free of the dielectric material of the dielectric layer 22 and, in particular, is free of the removed sections 26 of the dielectric layer 22, while the sections 24 of the dielectric layer 22 continue to cap the interconnects 14 after the sections 26 are removed.

A dielectric layer 30 is deposited over the interlayer dielectric layer 10 and sections 24 of dielectric layer 22 and then patterned to expose a region 32 in which airgaps are subsequently formed between the interconnects 14. The dielectric layer 30 may be composed of a dielectric material, such as silicon nitride or carbon-rich silicon nitride, deposited by chemical vapor deposition, and may be patterned with lithography and etching processes selective to the materials of the interlayer dielectric layer 10 and the sections 24 of the dielectric layer 22. The interlayer dielectric layer 10 is unmasked between one or more adjacent pairs of the interconnects 14, which are masked and covered by the sections 24 of the dielectric layer 22.

In an alternative embodiment, the etching process removing the sections 26 of the dielectric layer 22 prior to formation of the dielectric layer 30 may be omitted if the sections 26 are not formed as a consequence of tuning the deposition conditions.

Figure 4:
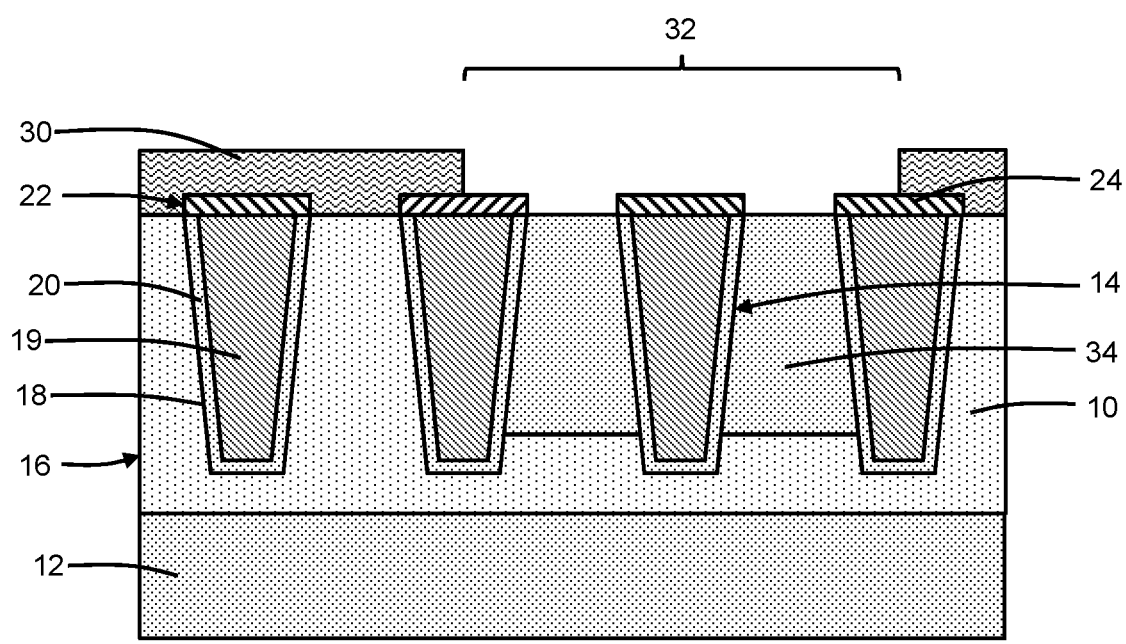

With reference to FIG. 4 in which like reference numerals refer to like features in FIG. 3 and at a subsequent fabrication stage, an upper portion 34 of the interlayer dielectric layer 10 exposed by the patterned dielectric layer 30 and between the adjacent interconnects 14 is modified in order to increase its etch rate in comparison with an unmodified condition. The modification process may be controlled during its performance such that a lower portion of the interlayer dielectric layer 10 beneath the upper portion 34 is unmodified and thereby has a lower etch rate than the upper portion 34.

In an embodiment, the modification process may be exposure to a plasma generated from a source gas mixture of, for example, nitrogen and hydrogen. In an embodiment, the modification process may damage the unmasked dielectric material of the upper portion 34 of the interlayer dielectric layer 10. In an embodiment, the modification process may damage the unmasked dielectric material of the upper portion 34 of the interlayer dielectric layer 10 through exposure to a plasma generated from a gas mixture of nitrogen and hydrogen. For example, the unmasked dielectric material of the interlayer dielectric layer 10 may be damaged by exposure to radicals (i.e., uncharged or neutral species) generated from a gas mixture of nitrogen and hydrogen in a remote plasma. The damage may cause a rearrangement within the dielectric material of the upper portion 34 of the interlayer dielectric layer 10 in which the target atoms are displaced from their original positions to new positions at which original local atomic coordination is not recovered, thereby generating broken atomic bonds.

Figure 5:
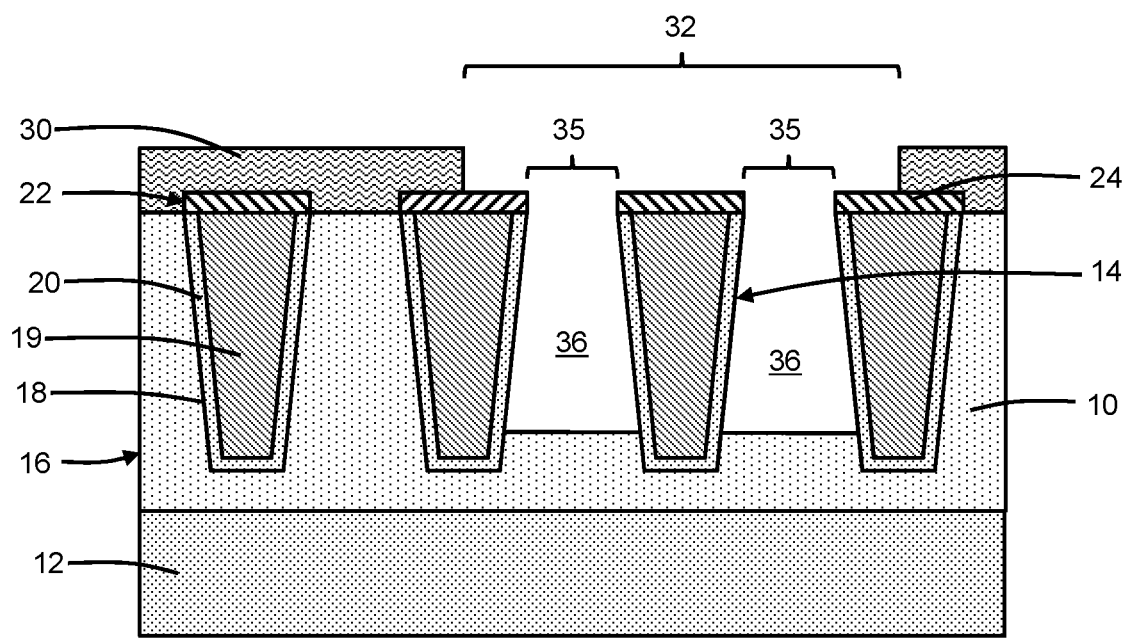

With reference to FIG. 5 in which like reference numerals refer to like features in FIG. 4 and at a subsequent fabrication stage, cavities 36 are formed between the interconnects 14 in region 32 by removing the dielectric material of the upper portion 34 of the interlayer dielectric layer 10 selective to the dielectric material of the lower portion of the interlayer dielectric layer 10. The damage to the upper portion 34 of the interlayer dielectric layer 10 increases its sensitivity to the etching process (i.e., the etch rate during the etching process) in comparison with the undamaged lower portion of the interlayer dielectric layer 10 that is not modified by the damage.

The sections 24 of dielectric layer 22 operate as caps that mask and cover the interconnects 14 such that the interconnects 14 exposed by the patterned dielectric layer 30 in region 32 are protected during the etching process. The protection afforded by the sections 24 of dielectric layer 22 prevents the erosion of the corners of the interconnects 14 by the etching process, which contrasts with conventional airgap formation processes in which the interconnects are exposed to the etching process and may suffer corner erosion. The absence of erosion avoids any increase to the resistance of the interconnects 14 that abut the damaged upper portion 34 of the interlayer dielectric layer 10. The sections 24 of dielectric layer 22 may be eroded, but not fully removed, by the etching process.

Figure 6:
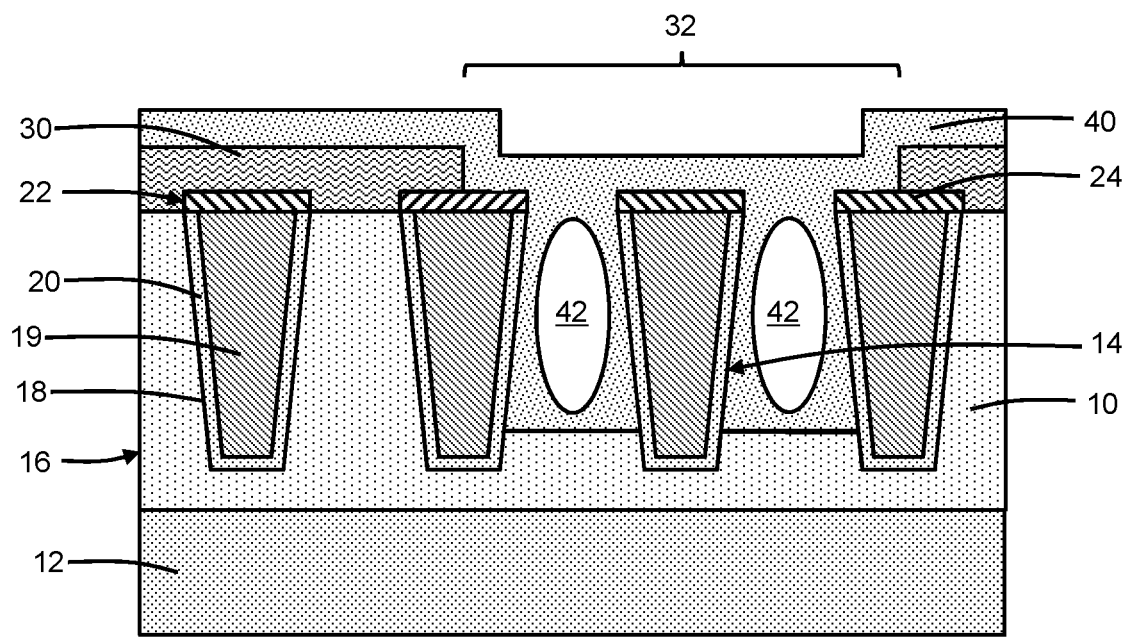

With reference to FIG. 6 in which like reference numerals refer to like features in FIG. 5 and at a subsequent fabrication stage, a dielectric layer 40 is deposited as a liner inside the cavities 36 and also deposits over the dielectric layer 30 and sections 24 of dielectric layer 22. The dielectric layer 40 may be conformal with a thickness that is substantially the same or constant regardless of the geometry of underlying features. The dielectric layer 40 may be composed of a dielectric material or a low-k dielectric material, such as silicon nitride (SiNx), silicon oxynitride (SiON), or silicon-carbon nitride (SiCN), deposited by atomic layer deposition. The dielectric layer 40 coats the surfaces inside each cavity 36 and pinches off at its entrance 35, during deposition, to form airgaps 42 that are encapsulated (i.e., fully surrounded) by the dielectric layer 40. To that end, the entrance 35 to each cavity 36 is closed before the cavity volume can be filled by the depositing dielectric material such that the airgaps 42 are closed and encapsulated inside the cavities 36.

The airgaps 42 may be characterized by a permittivity or dielectric constant of near unity (i.e., vacuum permittivity). The airgaps 42 may be filled by atmospheric air at or near atmospheric pressure, may be filled by another gas at or near atmospheric pressure, or may contain atmospheric air or another gas at a sub-atmospheric pressure (e.g., a partial vacuum). Due to the reduced permittivity in comparison with a solid dielectric material, the formation of the airgaps 42 lowers the capacitance of a localized portion of the metallization level 16.

The BEOL processing may continue to form additional metallization levels over the cap layer 46. In an embodiment, the metallization level 16 may represent the lowest BEOL metallization level that is stacked closest to the FEOL device structures.

Figure 7:
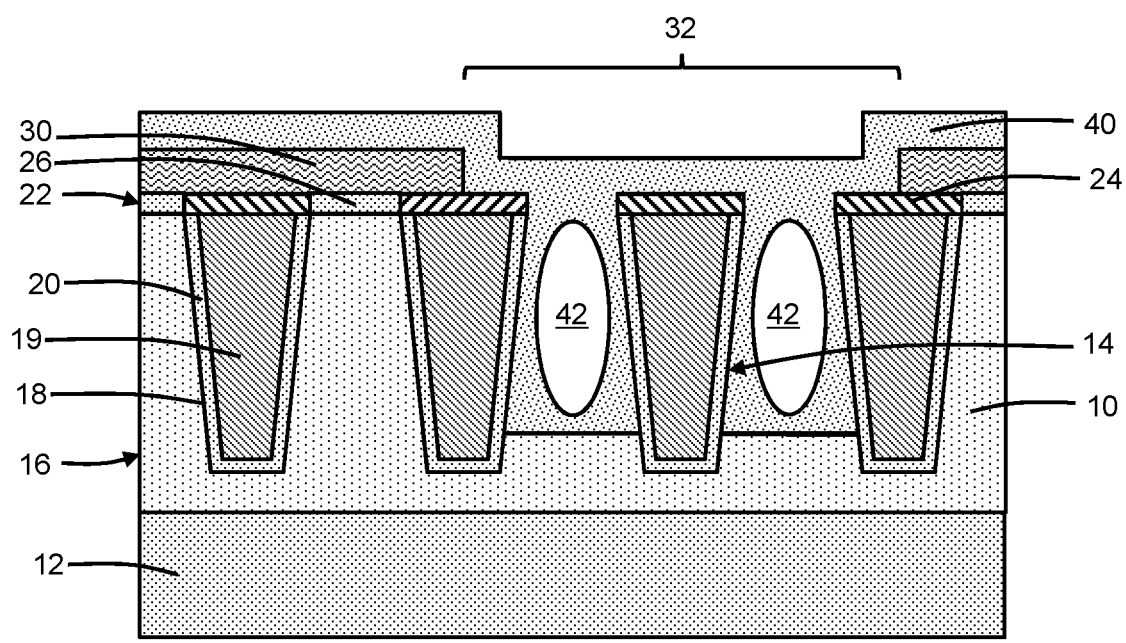
FIG. 7 is a cross-sectional view of a structure in accordance with alternative embodiments of the invention.

With reference to FIG. 7 in which like reference numerals refer to like features in FIG. 6 and in accordance with alternative embodiments, the sections 26 of the dielectric layer 22 may be left intact and may not be removed by an etching process selective to the sections 24 of the dielectric layer 22. The dielectric layer 30 is deposited over the interlayer dielectric layer 10 and the sections 24, 26 of dielectric layer 22, and the dielectric layer 30 is then patterned in the region 32 in which the airgaps 42 are subsequently formed between the interconnects 14. The sections 26 of the dielectric layer 22 are removed in region 32 as part of the process forming the cavities 36. The sections 26 of the dielectric layer 22 outside of the region 32 are included in the final construction of the metallization level 16.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a metallization level including an interlayer dielectric layer, a first interconnect having a first top surface, a second interconnect having a second top surface, and a cavity with an entrance between the first interconnect and the second interconnect;
a first dielectric layer including a first section arranged on the first top surface of the first interconnect, a second section arranged on the second top surface of the second interconnect, and a third section arranged on the interlayer dielectric layer, the first section of the first dielectric layer separated from the second section of the first dielectric layer by the entrance of the cavity; and
a second dielectric layer arranged to surround the cavity and to close the entrance to the cavity in order to encapsulate an airgap inside the cavity,
wherein the first section and the second section of the first dielectric layer are comprised of aluminum nitride, and the third section of the first dielectric layer is comprised of aluminum oxynitride.

2. The structure of claim 1 wherein the first interconnect and the second interconnect are comprised of copper.

3. The structure of claim 1 further comprising:
a third dielectric layer arranged at least in part over the first section and the second section of the first dielectric layer, the third dielectric layer including an opening arranged over the cavity.

4. The structure of claim 1 wherein the first dielectric layer is comprised of a dielectric material, the interlayer dielectric layer has a top surface, the first top surface of the first interconnect and the second top surface of the second interconnect are substantially coplanar with the top surface of the interlayer dielectric layer, and the top surface of the interlayer dielectric layer laterally between the first interconnect and the second interconnect is free of the dielectric material of the first dielectric layer.

5. The structure of claim 1 wherein the second dielectric layer is further arranged over the first section and the second section of the first dielectric layer.

6. The structure of claim 1 wherein the first top surface of the first interconnect has a first surface area, the first section of the first dielectric layer has a first area that is substantially equal to the first surface area, the second top surface of the second interconnect has a second surface area, and the second section of the first dielectric layer has a second area that is substantially equal to the second surface area.

7. The structure of claim 1 wherein the first section of the first dielectric layer is arranged in direct contact with the first top surface of the first interconnect, and the second section of the first dielectric layer is arranged in direct contact with the second top surface of the second interconnect.

8. A method comprising:
forming a metallization level including a first interconnect and a second interconnect in an interlayer dielectric layer;
depositing a first section of a first dielectric layer on a first top surface of the first interconnect a second section of the first dielectric layer on a second top surface of the second interconnect, and a third section on a first portion of the interlayer dielectric layer;
removing the third section of the first dielectric layer selective to the first section and the second section of the first dielectric layer to expose the first portion of the interlayer dielectric layer;
removing the first portion of the interlayer dielectric layer to form a cavity with an entrance between the first interconnect and the second interconnect; and
depositing a second dielectric layer on surfaces surrounding the cavity that pinches off to encapsulate an airgap inside the cavity,
wherein the first section and the second section of the first dielectric layer are comprised of aluminum nitride, and the third section of the first dielectric layer is comprised of aluminum oxynitride.

9. The method of claim 8 further comprising:
heating the first dielectric layer with an annealing process,
wherein the third section of the first dielectric layer increases in thickness during the annealing process.

10. The method of claim 8 further comprising:
depositing a third dielectric layer arranged at least in part over the first section and the second section of the first dielectric layer,
wherein the third dielectric layer includes an opening arranged over the first portion of the interlayer dielectric layer.

11. The method of claim 8 wherein the second dielectric layer is arranged over the first section and the second section of the first dielectric layer.

12. The method of claim 8 further comprising:
depositing a third dielectric layer arranged at least in part over the first section and the second section of the first dielectric layer,
wherein the third dielectric layer includes an opening arranged over the first portion of the interlayer dielectric layer, and the third dielectric layer is arranged in part between the second dielectric layer and the first section and the second section of the first dielectric layer.

13. The method of claim 8 further comprising:
depositing a third dielectric layer arranged at least in part over the first section, the second section, and the third section of the first dielectric layer,
wherein the third dielectric layer includes an opening arranged over the first portion of the interlayer dielectric layer.

14. The method of claim 8 wherein removing the first portion of the interlayer dielectric layer to form the cavity with the entrance between the first interconnect and the second interconnect comprises:
damaging the first portion of the interlayer dielectric layer; and
etching the first portion of the interlayer dielectric layer selective to a second portion of the interlayer dielectric layer beneath the first portion of the interlayer dielectric layer with an etching process,
wherein the first section of the first dielectric layer and the second section of the first dielectric layer respectively mask the first interconnect and the second interconnect during the etching process.

* * * * *